United States Patent [19]

Omoto

[11] Patent Number: 4,709,406
[45] Date of Patent: Nov. 24, 1987

[54] A.F.C. SYSTEM FOR BROAD-BAND FM RECEIVER

[75] Inventor: Noriaki Omoto, Osaka, Japan

[73] Assignee: Matsushita Electric Industrial Co., Ltd., Japan

[21] Appl. No.: 908,897

[22] Filed: Sep. 18, 1986

[30] Foreign Application Priority Data

Sep. 19, 1985 [JP] Japan .................................. 60-206824
Sep. 19, 1985 [JP] Japan .................................. 60-206825

[51] Int. Cl.⁴ ............................................. H04B 1/16
[52] U.S. Cl. ..................................... 455/208; 455/182; 455/183; 455/195; 455/260; 455/265
[58] Field of Search ............... 455/182, 183, 208, 258, 455/260, 265, 195

[56] References Cited

U.S. PATENT DOCUMENTS 4,348,772 9/1982 Leland et al. ....................... 455/260
4,380,826 4/1983 Usugi ................................... 455/183
4,392,254 7/1983 Ecklund ............................... 455/182
4,476,584 10/1984 Dages ................................... 455/182
4,598,422 7/1986 Fellman ............................... 455/182

FOREIGN PATENT DOCUMENTS 55-23674 2/1980 Japan .

Primary Examiner—Robert L. Griffin
Assistant Examiner—Elissa Seidenglanz
Attorney, Agent, or Firm—Lowe, Price, LeBlanc, Becker & Shur

[57] ABSTRACT

An A.F.C. control system for reception of wide-band F.M. transmission such as satellite transmissions, in which a center frequency of an F.M. I.F. signal is repetitively and alternately compared with an upper and a lower frequency limit value so long as the center frequency lies between these values, with the results of the comparisons being respectively stored in two latch memories, whose contents thereby indicate any error of the center frequency relative to the frequency limits. Any departure of the center frequency from between the limits is corrected by successive frequency shifts of the local oscillator frequency, with the results of correction being indicated by the latch memory contents and with the number of frequency shifts being determined accordingly.

14 Claims, 20 Drawing Figures

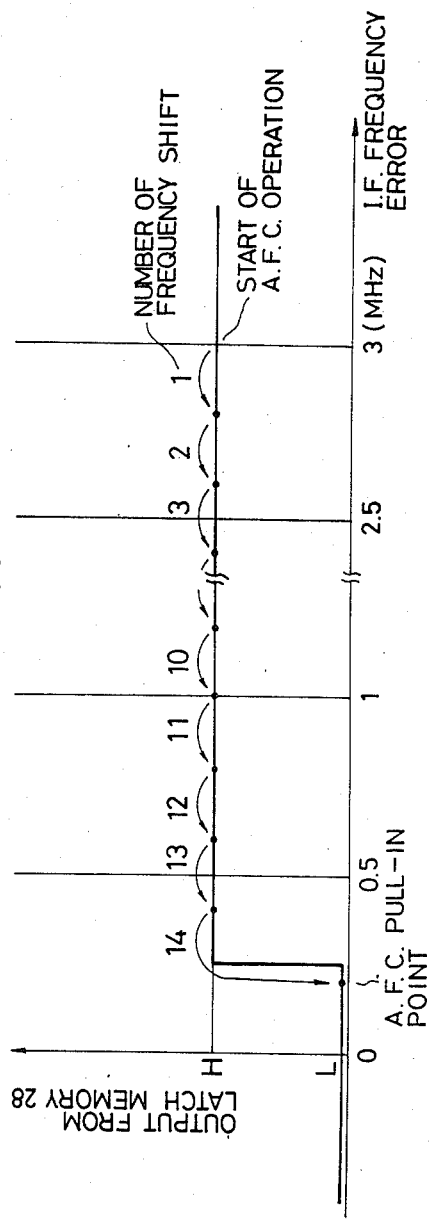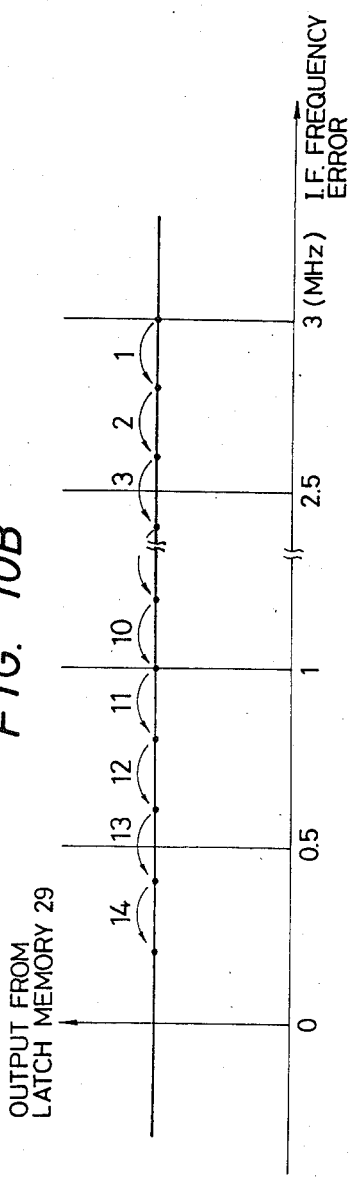

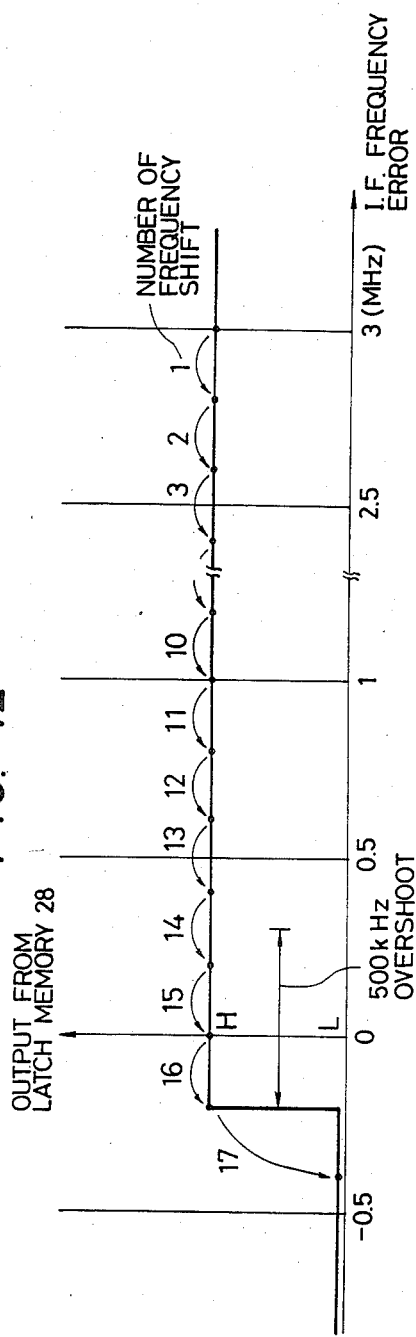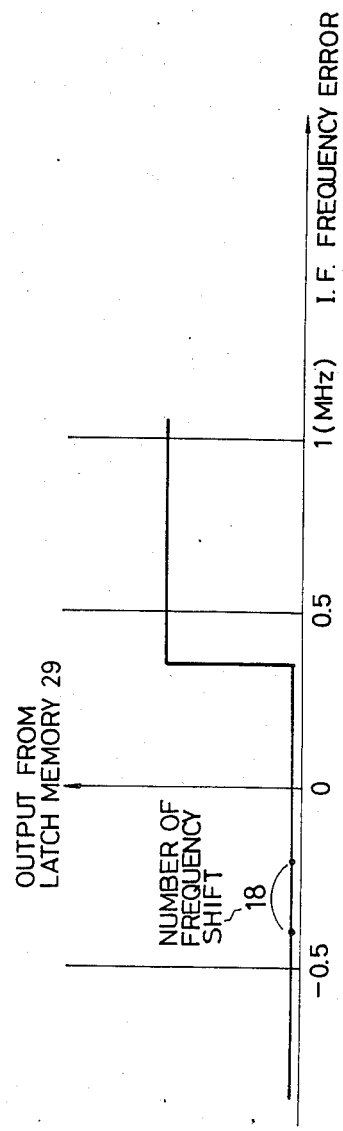

A.F.C. SYSTEM FOR BROAD-BAND FM RECEIVER

BACKGROUND OF THE INVENTION

The present invention relates to an A.F.C. (automatic frequency control) system for an FM radio receiver, and in particular to an A.F.C. system for a receiver to be utilized for reception of broad-band FM signals transmitted from an earth satellite.

In an FM receiver which utilizes a frequency synthesizer for tuning operation, the accuracy with which the frequency of the local oscillator is maintained will be identical to that of the reference frequency signal of the frequency synthesizer circuit. Usually a quartz crystal oscillator is utilized to produce the reference frequency signal, so that if the frequency accuracy of the recived signal is sufficiently high, a satisfactory degree of frequency accuracy for the I.F. (intermediate frequency) signal will be attained without the need to incorporate an A.F.C. system in the receiver. However in the case of a receiver system for reception of transmissions from an orbiting satellite, the received microwave band signal is first converted into a first I.F. signal by a down-converter (positioned close to the antenna, i.e. outdoors), and this signal is led to the receiver, situated indoors, through a cable. The first I.F. signal is then converted to a second I.F. signal within the receiver. Tuning, i.e. selection of a desired reception channel, is performed by the process of frequency conversion into the second I.F. signal, through variation of the frequency of the local oscillator signal which is employed in this conversion. With such a system, even if the local oscillator signal of the indoors receiver is generated by a frequency synthesizer circuit and hence has excellent frequency accuracy, satisfactory frequency accuracy will not be attained for the second I.F. if the conversion frequency accuracy of the down-converter, situated outdoors, is not sufficiently high. In practice it is found that a frequency drift of several MHz will occur due to ambient temperature variations, in the oscillation frequency of a local oscillator of a down-converter which is situated outdoors. In the case of the second I.F. signal however, even if the frequency accuracy is relatively poor, the amount of frequency drive will be held to within several hundred kHz. Thus, even if a frequency synthesizer circuit system is employed in the tuner circuit of such a receiver, it is essential to utilize an A.F.C. system in order to maintain the frequency accuracy of the second I.F. signal at a sufficiently high level. In the following, the term "local oscillator" will be restricted to signifying the local oscillator whose signal is utilized in producing the second I.F. signal, while the second I.F. signal will be simply referred to as the I.F. signal. An example of a prior art frequency synthesizer circuit type of tuner circuit, which is provided with an A.F.C. system, is described in Japanese Patent No. pb 55-23674. FIG. 1 is a block diagram of this prior art example, in which reference numeral 1 denotes a received signal input terminal, numeral 2 denotes a H.F. amplifier, numeral 3 denotes a frequency mixer, numeral 4 denotes a voltage-control type of local oscillator, numeral 5 denotes a PLL (phase lock loop) type of frequency synthesizer circuit, numeral 6 denotes an I.F. amplifier, numeral 7 denotes an FM demodulator, numeral 8 denotes a demodulated signal output terminal, numeral 9 denotes a low-pass filter (hereinafter referred to as LPF), and numeral 10 denotes a frequency error detection circuit. FIG. 2 shows an example of a circuit for the frequency error detection circuit 10, in which the demodulated output signal from the FM demodulator 7 is smoothed by transfer through a LPF 9, to thereby derive the DC component of the demodulated signal. This DC component is compared with fixed reference voltage levels $V_{r1}$ and $V_{r2}$ in a pair of voltage comparators 10a and 10b respectively. The DC component of the demodulated FM signal which is output from LPF 9 represents the average voltage level of the demodulated FM signal. This average voltage level corresponds to the average frequency of the I.F. signal which is produced by mixer 3. By comparing this average voltage level with the predetermined reference voltage levels $V_{r1}$ and $V_{r2}$ by the circuit shown in FIG. 2, it can be determined whether the center frequency of the I.F. signal has drifted from a predetermined I.F. frequency by more than a predetermined frequency range. In addition, the circuit detects the direction of this frequency outside the predetermined range, i.e. the output signals from terminals 10e, 10f respectively indicate whether the center frequency of the I.F. signal frequency is lower than or higher than the specified I.F. frequency. The output signals from terminals 10e and 10f are applied to the PLL frequency synthesizer circuit 5, which responds by performing fine adjustment of the frequency of oscillation of the local oscillator 4 such as to counteract the frequency drift, i.e. to maintain the amount of frequency drift outside the predetermined range to a sufficiently small amount.

However with the arrangement of FIG. 2, the frequency reference for A.F.C. system operation is constituted by the demodulator circuit 7 itself. In the case of a receiver system for reception of transmissions from an earth satellite, the FM demodulator does not display very good temperature stability, with respect to the relationship between input frequency and output voltage, since the most important design requirement for such a demodulator is that it must be capable of handling high frequency wide-band FM signals. For this reason, it is difficult to realize an A.F.C. system of the form shown in FIG. 1 which will maintain a high degree of I.F. signal frequency accuracy. If the FM signal must maintain a high degree of linearity in the demodulation process, as is true in the case of a video signal, then it is extremely important to ensure that amplitude and phase errors do not arise. If I.F. frequency drift occurs, then such errors will be produced as a result of passing the FM I.F. signal through the I.F. band-pass filter.

In order to overcome the problem described above, the assignee of the present invention has previously proposed (in Japanese patent application No. 60-205762, filed on Sept. 18, 1985) an A.F.C. system having the objective of overcoming the problems described above. In that A.F.C. system, a highly accurate reference frequency signal is utilized as a frequency reference. The FM I.F. signal is applied to the inputs of two frequency dividers having respectively different frequency division ratios. These frequency division ratios and the frequency of the reference frequency signal are selected such that, when the I.F. signal center frequency coincides with an upper limit frequency (which is higher than a predetermined I.F. frequency by a specific amount), the output of one of the frequency dividers will coincided in frequency with the reference signal, and such that when the I.F. signal center frequency coincides with a lower limit frequency (which is lower than the predetermined I.F. frequency by a specific amount), the output of the other frequency divider will coincide in frequency with the reference signal. Two frequency comparators are also utilized, with the reference frequency signal being applied to one input of each of these frequency comparators and the outputs from the frequency dividers being respectively applied to the other inputs of the frequency comparators. The resultant outputs signals from the frequency comparators are passed through respective integrator circuits or low-pass filters, to thereby produce two frequency comparison signals, whose levels indicate the frequency relationship between the reference frequency signal and the I.F. signal. These signals are applied to a frequency synthesizer circuit which produces a control voltage to control the local oscillator frequency, to thereby implement fine adjustment of that control voltage and hence fine control of the local oscillator frequency and hence the I.F. frequency, in accordance with the frequency relationship between the reference frequency signal and the I.F. signal.

With such an A.F.C. system, designating the upper and lower limits of frequency error detection with respect to the specified I.F. frequency as $f_H$ and $f_L$, the reference signal frequency as $f_O$, and the frequency division ratios of the frequency dividers as $N_H$ and $N_L$ respectively, then the following relationships must be satisfied:

$$f_H = N_H \cdot F_S \quad (1)$$

$$f_L = N_L \cdot F_S \quad (2)$$

$$f_L < f_O < f_H \quad (3)$$

It can thus be understood that when the center frequency of the I.F. signal is higher than the upper detection limit $f_H$, the output frequency from the frequency divider having the frequency division ratio $N_H$ will become higher $f_H/N_H$, and so (from equation (1)) will become higher than the reference signal frequency $F_S$. As a result, the output from the frequency comparator which receives the latter frequency divider output and the reference frequency signal will indicate that the center frequency of the I.F. signal has become higher than the upper detection limit $f_H$. Similarly, when the center frequency of the I.F. signal is higher than the lower detection limit $f_L$, the output frequency from the frequency divider having the division ratio $N_L$ will become lower than $f_L/N_L$, and so (from equation (2) above) will become lower than the reference signal frequency $F_S$. As a result, the output from the frequency comparator which receives the latter frequency divider output and the reference frequency signal will indicate that the center frequency of the I.F. signal has become lower than the lower detection limit $f_L$.

It is possible to utilize a digital circuit as such a frequency comparator, to perform phase (frequency) comparison. However a receiver for reception of earth satellite transmissions produces a wide-band IF signal, having a high value of FM modulation index. Thus, it is necessary to make the frequency division ratios $N_L$ and $N_H$ sufficiently high, in order to ensure that the FM modulation index of the output signals from these frequency division ratios will be low enough to ensure that erroneous operation of the frequency comparators does not occur as a result of the frequency deviation due to wide-band FM modulation of the I.F. signal.

The output signals from the frequency comparators are then passed through simple integrator circuits (or low-pass filters) to derive the DC component of each signal, to thereby obtain two frequency comparison signals. One of these frequency comparison signal will change between a high and a low logic level when the amount of error of the center frequency of the I.F. signal reaches the upper detection limit $f_H$, while the other frequency comparison signal will similarly change in logic level when the I.F. signal reaches the lower detection limit $f_L$. The combination of these two frequency comparison signal can be utilized to judge which of three possible conditions is currently true of the center frequency $f_C$ of the I.F. signal, i.e. $f_C < f_L$, $f_L < f_C < f_H$, or $f_H < f_C$. Thus the frequency comparison signal can be utilized to judge whether fine adjustment of the local oscillator frequency should be performed (i.e. by fine adjustment of the control voltage applied to the local oscillator in the case of a receiver employing a synthesizer circuit to produce such a control voltage), and also the direction in which this fine adjustment of the local oscillator frequency is to be executed.

An example of such an A.F.C. system is shown in the block diagram of FIG. 3. As in the previous example, a received signal (i.e. from a down-converter) is transferred through an H.F. amplifier to a mixer, to produce an I.F. signal which is applied to an FM demodulator 7. A synthesizer circuit 5 such as a PLL type of frequency synthesizer, produces a frequency control voltage which is applied to a local oscillator 4 to control the local oscillator frequency which is applied to mixer 3. The I.F. signal is supplied to each of two frequency dividers 9 and 10, which have respective frequency division ratios $N_H$ and $N_L$. The resultant output signals from frequency dividers 9 and 10 are applied to inputs of two frequency comparators 12 and 13 respectively, while a reference frequency produced from a reference signal oscillator 11 at a frequency $F_S$ is applied to each of the other inputs of the frequency comparators 12 and 13. Each of the frequency comparators 12 and 13 can be of digital type, for example having the configuration shown in FIG. 5. Such a frequency comparator displays a relationship between phase (frequency) and the DC component of the output therefrom having the form shown in FIG. 4. The outputs from frequency comparators 12 and 13 are transferred through respective low-pass filters (LPFs) 14 and 15, to remove AC components of the comparator output signals and thereby produce respective frequency comparison signals.

For each of the frequency comparators 11, 12 in FIG. 3, if the center frequency of the frequency-divided I.F. signal supplied to the frequency comparator is higher than the reference frequency frequency, then the corresponding frequency comparison signal goes to a high logic level (hereinafter referred to as the H level), while if the center frequency of the frequency-divided I.F. signal is lower than the reference frequency frequency, then the corresponding frequency comparison signal will go to a low logic level (hereinafter referred to as the L level). FIGS. 6A and 6B are graphs showing the variation of of the frequency comparison signals produced from LPFs 14 and 15 respectively, in which I.F. signal center frequency are plotted along the horizontal axis and the level of the frequency comparison signal along the vertical axis. Designating the specified center frequency of the I.F. signal as $f_O$, the reference frequency frequency and the frequency division ratios $N_H$, $N_L$ must satisfy the following relationship $$F_S \times N_L < f_O < F_S \times N_H$$

As can be understood from FIG. 6, when the first frequency comparison signal (i.e. the output from LPF 14) is at the H level, the center frequency of the I.F. signal will be higher than the specified frequency by an amount which exceeds a predetermined limit frequency ($F_S \times N_H$). Thus it is necessary to apply fine adjustment to the control voltage of local oscillator 4, by means of synthesizer circuit 5, such as to correct this frequency error. Similarly if the second frequency comparison signal (i.e the output from LPF 15) is at the L level then this indicates that the center frequency of the I.F. signal frequency is lower than the specified I.F. frequency by a specific amount, i.e. is lower than a lower limit frequency ($F_S \times N_L$). The synthesizer circuit 5 must therefore apply correction to the local oscillator frequency in a direction to correct this frequency error.

It is necessary for an FM receiver for reception of earth satellite transmissions to have an A.F.C. control accuracy which is within at least ±300 kHz, i.e. the frequency error range should ±300 kHz with respect to the specified center frequency of the I.F. signal. Thus each of the quantities ($F_S \times N_H - f_O$), and ($f_O - F_S \times N_L$) should be selected to be within 300 kHz.

For example if the specified center frequency of the I.F. signal $f_O$ is 510 MHz, the reference frequency frequency $F_S$ is 10 kHz, one of the frequency division ratios $N_H$ is 51030 and the other frequency division ratio $N_L$ is 50970, then the above relationships are satisfied.

With the system of FIG. 3 described above, the I.F. signal is frequency divided by two frequency dividers having mutually different frequency division ratios, and the frequency-divided output signals are compared in frequency with a reference frequency, whereby a frequency error which causes the center frequency of the I.F. signal to depart from a predetermined frequency error range (centered on the specified if frequency) can be accurately detected. The frequency stability of this system is determined by the reference frequency, so that if a highly stable and accurate oscillator circuit such as a quartz crystal controlled oscillator is utilized to produce the reference frequency, an A.F.C. system can be realized which has a high degree of frequency control accuracy.

However with an A.F.C. system of the form shown in FIG. 3, although the frequency accuracy is extremely high and the long-term frequency drift is almost zero, it is necessary to employ two separate frequency dividers, two frequency comparators, and two low-pass filters. Thus this system has the disadvantage that the manufacturing cost will be relatively high.

SUMMARY OF THE INVENTION

It is an objective of the present invention to provide an automatic frequency control system which will hold the center frequency of a frequency-modulated intermediate frequency signal within a predetermined frequency error range with respect to a predetermined intermediate frequency value, to a high degree of accuracy, while ensuring a relatively low manufacturing cost for such a system.

It is a further objective of the present invention to provide an automatic frequency control system having the above advantages and moreover whereby the time required following a tuning operation (i.e. for selection of a new reception channel) until an automatic frequency control lock condition is achieved, can be substantially reduced by comparison with prior art types of circuit.

More specifically, an automatic frequency control system according to the present invention has the function of performing correction of a frequency error of a center frequency of a frequency-modulated intermediate frequency signal with respect to a predetermined intermediate frequency value such as to hold the magnitude of said frequency error within a predetermined frequency error range. Such an automatic frequency control system is for use in frequency modulation receiver system which includes local oscillator circuit means for producing a local oscillator signal and a mixer coupled to receive the local oscillator signal for producing the frequency-modulated intermediate frequency signal. The automatic frequency control system comprises:

control means and frequency comparison means controlled by the control means to selectively operate in a first status for comparing the center frequency of the intermediate frequency signal with an upper limit frequency of the frequency error range and in a second status for comparing the center frequency of the intermediate frequency signal with a lower limit of the frequency error range. A frequency comparison signal indicative of results of the frequency comparisons is produced by the frequency comparison means and stored by first and second latch memory means controlled by the control means as data indicative of the relationship between the center frequency of the intermediate frequency signal and the upper and lower limit frequencies.

Also, a frequency adjustment means is controlled by the control means for adjusting the local oscillator frequency;

the control means operates, following the frequency comparison operation, to determine whether the data stored in the first and second latch memory means indicates that the center frequency of the intermediate frequency signal is within the frequency error range. When the center frequency is determined to be within the frequency error range, the control means executes successively alternating comparisons of the center frequency of the intermediate frequency signal with the upper and lower limits respectively by the frequency comparison means. The level of the frequency comparison signal is stored in the first latch memory means following a comparison of the center frequency of the intermediate frequency signal with the upper limit frequency and the level of the frequency comparison signal is stored in the second latch memory means following a comparison of the center frequency of the intermediate frequency signal with the lower limit frequency. The control means further operates, when the center frequency of the intermediate frequency signal is determined to be outside the frequency error range as indicated by the data stored in the first and second latch memory means, and control the frequency adjustment means such as to adjust the local oscillator frequency in order to bring the center frequency of the intermediate frequency signal within the frequency error range.

Furthermore with an automatic frequency control circuit according to the present invention, the control means operates, when the center frequency of the intermediate frequency signal is determined to be higher than the upper frequency limit as indicated by the data stored in the first and second latch memory means, and repetitively executes a series of.

Firstly, the center frequency of the intermediate frequency signal is compared with the upper frequency limit.

The frequency comparison signal level is then stored in the first latch memory means, and the frequency adjustment means is controlled such as to decrease the local oscillator frequency by a fixed amount.

When the center frequency of the intermediate frequency signal is judged to be lower than the lower frequency limit, as indicated by the data stored in the first and second latch memory means, the control means repetitively executes another series of operations.

Firstly, the center frequency of the intermediate frequency signal is compared with the lower frequency limit.

The frequency comparison signal level is stored in the second latch memory means, and;

the frequency adjustment means is controlled such as to increase the local oscillator frequency by a fixed amount.

An A.F.C. system according to the present invention employs a highly stable reference frequency as a frequency reference, with the reference frequency and an I.F. signal being applied to respective variable frequency dividers to thereby produce a frequency-divided I.F. signal and a frequency-divided reference signal which are applied to the inputs of a frequency comparator. The output signal from the frequency comparator is passed through a low-pass filter to thereby derive the frequency comparison signal, which is applied to respective inputs of two latch memory circuits. The frequency division ratios of the variable frequency dividers are respectively controlled by a controller to selectively establish two different combinations of these frequency division ratios, while the controller also controls latch operations by the latch memory circuits. The values of the reference frequency and the frequency division ratios are selected such that, with one of these combinations of frequency division ratios established by the controller, the center frequency of the intermediate frequency signal is, in effect, compared with the upper frequency limit referred to above, while with the other combination of frequency division rations established, the center frequency of the intermediate frequency signal is, in effect, compared with the lower frequency limit referred to above.

BRIEF DESCRIPTION OF THE DRAWINGS

FIGS. 10A and 10B respectively show the relationships between I.F. signal center frequency and output signals from a first and a second latch memory circuit in the embodiment of FIG. 7, during A.F.C. pull-in operation;

FIG. 12 shows the relationship between I.F. signal center frequency and the output signal from the first latch memory circuit in the embodiment of FIG. 7 during A.F.C. pull-in operation, while FIG. 13 shows the same relationship when A.F.C. pull-in is completed;

DESCRIPTION OF THE PREFERRED EMBODIMENTS

Figure 3:
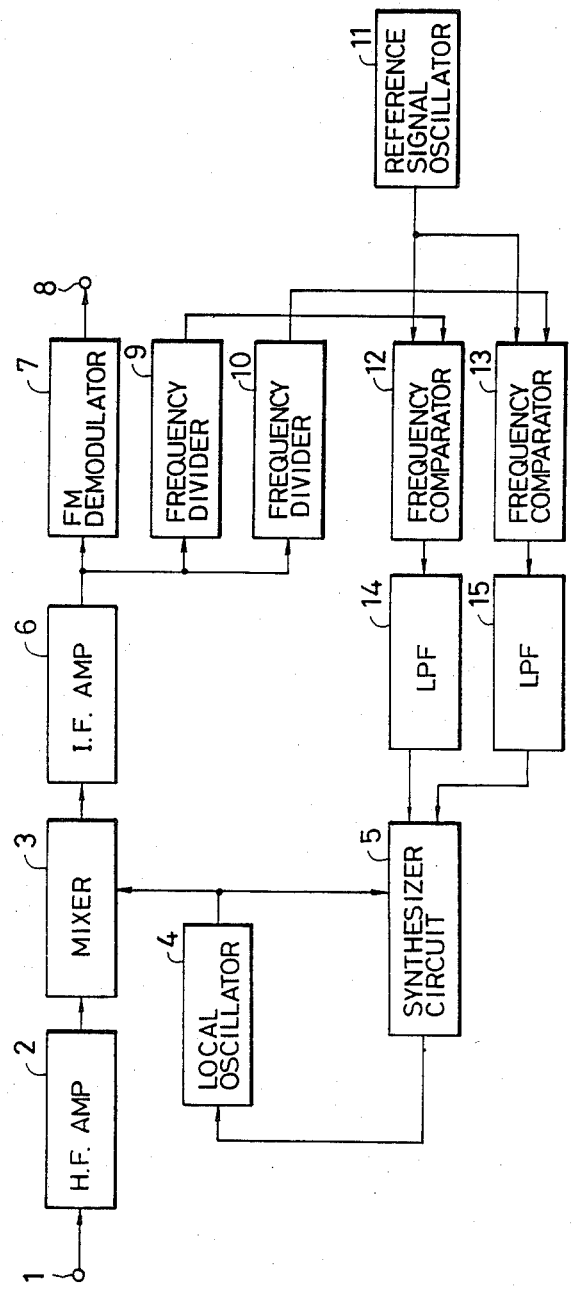
FIG. 3 is a block circuit diagram of an example of an A.F.C. system for broad-band FM reception, which has been previously proposed by the assignee of the present invention.
Figure 7:
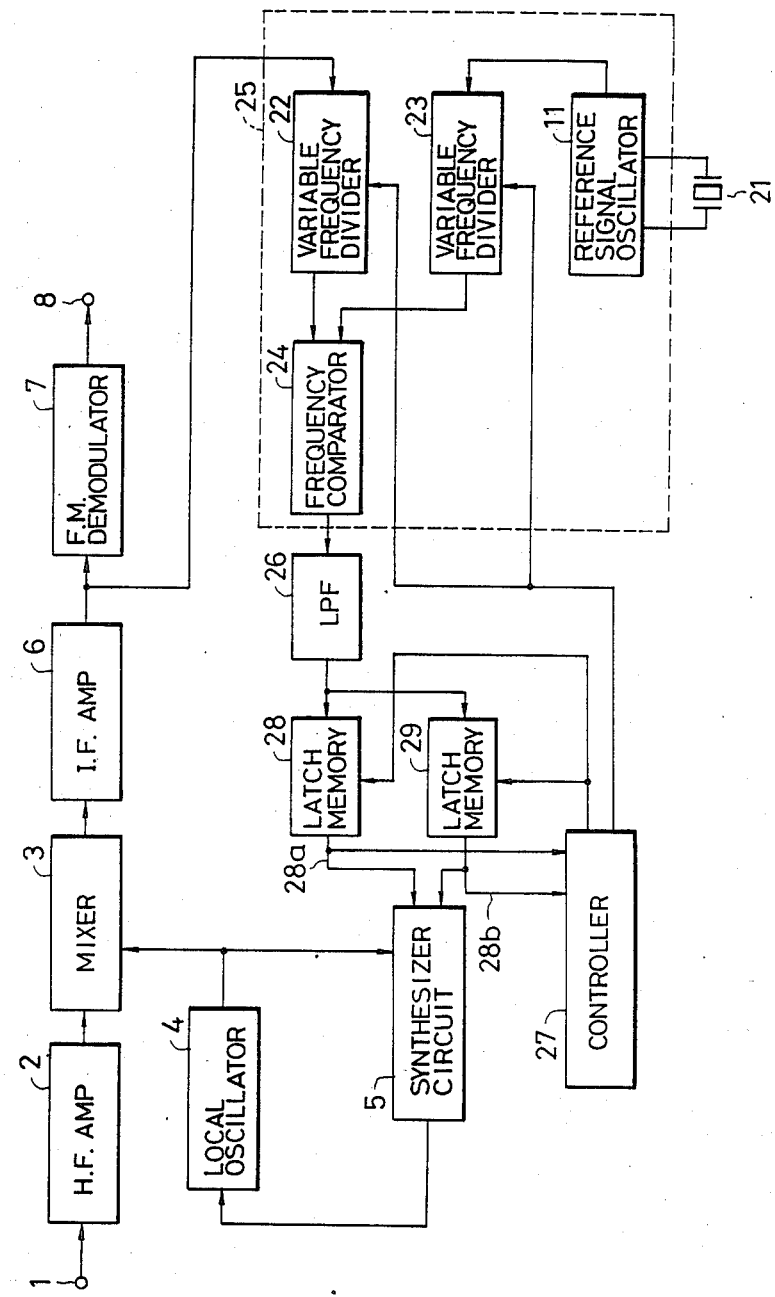
FIG. 7 is a block circuit diagram of a first embodiment of the present invention.

A first embodiment of an A.F.C. system according to the present invention will be described referring to the block diagram of FIG. 7. In FIG. 7, blocks which correspond to blocks in the A.F.C. system example of FIG. 3 are designated by corresponding reference numerals. A received FM signal (e.g. supplied from a down-converter) is applied from an input terminal 1 through an H.F. amplifier 2 to a mixer 3, to produce a FM I.F. signal which is passed through an I.F. amplifier 6 to be demodulated by a FM demodulator 7. A demodulated FM signal thereby appears on an output terminal 8. The frequency of oscillation of a voltage-controlled local oscillator 4 is determined by a control voltage which is produced by a frequency control voltage synthesizer circuit 5. The combination of frequency control voltage synthesizer circuit 5 and local oscillator 4 will be assumed in the following to constitute a PLL (phase lock loop) circuit, however the invention is also applicable to a receiver system employing a voltage synthesizer circuit for control of the local oscillator frequency which employs a digital/analog converter to produce a frequency control voltage, for example.

A reference frequency of high frequency accuracy is generated by a reference frequency oscillator 11, which employs a quartz crystal vibrator element 21. The oscillation frequency of reference signal oscillator 11 will be designated as $F_S$. The reference frequency and I.F. signal are supplied to variable frequency dividers 22 and 23 (i.e. frequency dividers whose respective division ratios can be controllably set to at least two different values) respectively, and whose output signals are applied to a frequency comparator 24.

Figure 4:
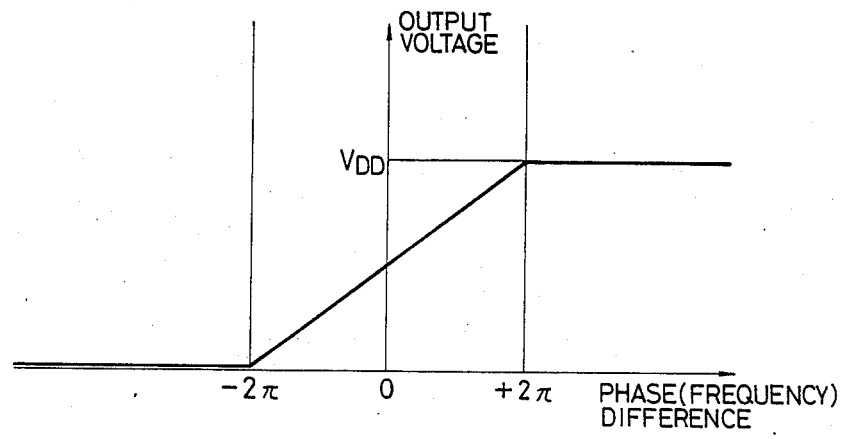
FIG. 4 is a graph of the variation of DC voltage component of an output signal, with respect to input signal frequency difference, for a digital type of frequency comparator.
Figure 5:
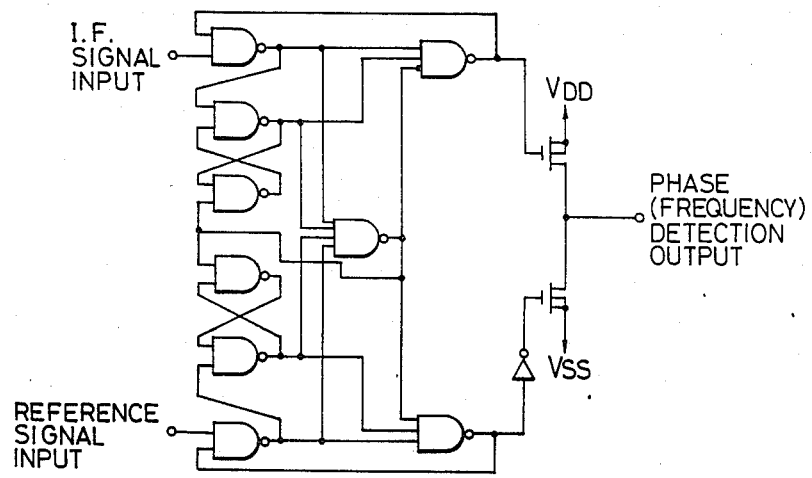
FIG. 5 is a circuit diagram of an example of a digital type of frequency comparator.
Figure 6:
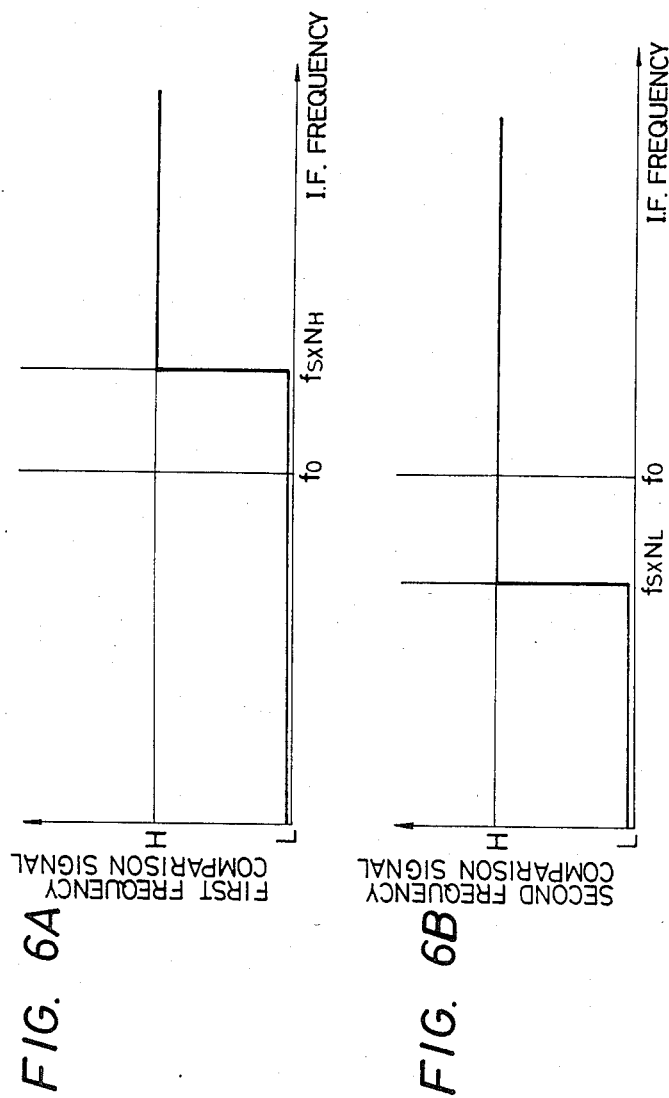
FIGS. 6A and 6B respectively show the relationships between output voltage level and I.F. center frequency, from the low-pass filters shown in the circuit of FIG. 5.

The circuit section 25 shown surrounded by a broken-line outline in FIG. 7 is a PLL (phase lock loop) LSI section in this embodiment i.e. a circuit portion contained within a generally used type of frequency synthesizer circuit formed in an integrated circuit. The frequency division ratios of the variable frequency dividers 22 and 23 are controlled by a signal applied from a controller 27, which is implemented externally to the LSI section 25. The variable frequency divider 22 can be set to either of two frequency division ratios designated as $N_{IH}$ and $N_{IL}$, while the variable frequency divider 23 can be set to two frequency division ratios $N_{SH}$ and $N_{SL}$. The frequency comparator 24 is preferably of digital configuration, e.g. as shown in FIG. 5 above, having the relationship between the input signal phase and output voltage shown in FIG. 4, i.e. with the output voltage from the frequency comparator attaining the H level if the frequency-divided I.F. signal applied thereto from variable frequency divider 22 is higher than the frequency-divided reference signal applied thereto from variable frequency divider 23, and attaining the L level if the frequency-divided I.F. signal is lower than the frequency divided reference signal. The AC components of the output signal from the frequency comparator 24 (e.g. the reference frequency component) are removed by a LPF 26, to thereby derive a frequency comparison signal.

Designating the specified I.F. frequency as $f_O$, the upper and lower limits of the frequency error range (defined hereinabove) as $f_H$ and $f_L$, the following relationships must be satisfied by the selected values of $N_{IH}$, $N_{SH}$, $N_{IL}$, $N_{SL}$ and $F_S$:

$$f_H = F_S \cdot N_{IH}/N_{SH} \tag{6}$$

$$f_L = F_S \cdot N_{IL}/N_{SL} \tag{7}$$

$$f_L < f_O < f_H \tag{8}$$

The logic level of the frequency comparison signal from LPF 26 is memorized in each of a pair of latch memory circuits 28 and 29, at timings determined by signals applied to the latch memory circuits 28 and 29 from the controller 27. The relationships between the output signals from latch memory circuits 28 and 29, i.e. the frequency comparison signal levels memorized therein, and the I.F. signal frequency, are shown in FIGS. 8A and 8B.

The basic operation of the embodiment of FIG. 7 is as follows. Firstly, if it is assumed that the center frequency of the I.F. signal is within the predetermined frequency error range, i.e. the center frequency is higher than the lower limit frequency $f_L$ and lower than the upper limit frequency $f_H$, then controller 27 controls the operation of the variable frequency dividers 22 and 23 such as successively and alternately switch this operation between a first operating status in which the variable frequency dividers of the variable frequency dividers 22 and 23 are $N_{IH}$ and $N_{SH}$ respectively, and a second status in which these variable frequency dividers are $N_{IL}$ and $N_{SL}$ respectively. After the first status has been established, so that the center frequency of the I.F. signal is compared with the upper frequency limit $f_H (= f_S \cdot N_{IH}/N_{SH})$ of the frequency error range, the controller 27 waits for a sufficient length of time (detection delay time, as described hereinafter) for the output signal level from LPF 26, i.e. the frequency comparison signal, to attain a level which correctly represents the result of this frequency comparison operation. If the center frequency of the I.F. signal is lower than the upper frequency limit $f_H$, then when comparison is performed with the frequency division ratios set to $N_{IH}$ and $N_{SH}$ the frequency comparison signal will be at the L level, so that this L level state is stored as data in latch memory circuit 28, while if the center frequency of the I.F. signal is higher than $f_H$ then the frequency comparison signal will be at the H level, and this state will be stored in latch memory circuit 28.

Similarly, after the second operating status of variable frequency dividers 22 and 23 has been established, so that the center frequency of the I.F. signal is compared with the lower frequency limit $f_L (= f_S \cdot N_{IL}/N_{SL})$ of the frequency error range, the controller 27 waits for the detection delay time to elapse, and then stores the output signal level from LPF 26, i.e. the frequency comparison signal level, in latch memory circuit 29. If the center frequency of the I.F. signal is lower than the lower frequency limit $f_L$, then the frequency comparison signal will be at the L level in this case, so that an L level state is stored as data in latch memory circuit 29 while if the center frequency of the I.F. signal is higher than $f_L$, the frequency comparison signal will be at the H level, and this state will be stored in latch memory circuit 29.

Figure 8A:
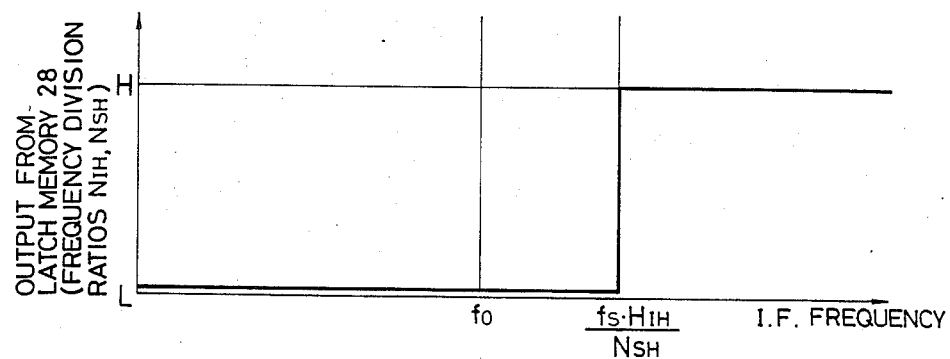
FIGS. 8A and 8B respectively show the relationships between output voltage level and I.F. center frequency, from two latch memory circuits shown in the circuit of FIG. 7.
Figure 8B:
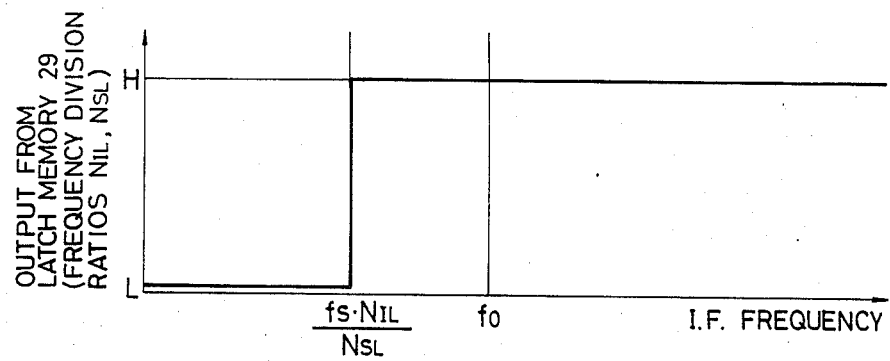

It will be apparent from FIGS. 8A and 8B that the combination of data stored in latch memories 28 and 29 (and hence the output signal levels produced by latch memories 28 and 29 respectively) following such a data storage operation will indicate the current relationship between the center frequency of the I.F. signal and the predetermined frequency error range. That is to say, if the output signal from latch memory circuit 29 is at the L level, then this indicates that the center frequency of the I.F. signal is below the lower frequency limit $f_L$, i.e. the data contents of latch memory circuits 28 and 29 indicate that the center frequency of the I.F. signal must be adjusted upwards, to bring that frequency back within the frequency error range. If the output signal from latch memory circuits 28 is at the H level, then this indicates that the center frequency of the I.F. signal is higher than the upper limit frequency $f_H$, so that the center frequency must be adjusted downwards. If on the other hand the output signal from the latch memory circuit 28 is at the L level while the output signal from latch memory circuit 29 is at the H level, then this indicates that the center frequency of the I.F. signal is within the predetermined frequency error range, so that no adjustment of the center frequency is necessary.

Each time that the controller 27 has stored new data in latch memory circuit 28 or latch memory circuit 29, the synthesizer circuit 5 makes a judgement as to whether the combination of data stored in latch memory circuit 28 and latch memory circuit 29 indicates that the center frequency of the I.F. signal is within the predetermined frequency error range, or whether the data indicates that correction of the center frequency is required. If correction is required, then the synthesizer circuit 5 judges from the stored data in latch memory circuits 28 and 29 the direction required for this correction. If correction is found to be necessary, then the synthesizer circuit 5 applies a fixed change in voltage to the frequency control voltage supplied to local oscillator 4, with the direction of this voltage change and hence the direction of the resultant frequency change of the local oscillator frequency being determined by the direction of correction required, and with the amplitude of the change in frequency control voltage (and hence the amplitude of the resultant change in local oscillator frequency) being a fixed quantity.

If for example, following a frequency comparison with the frequency division ratios of the variable frequency dividers 22 and 23 set to $N_{IH}$ and $N_{SH}$ respectively, the center frequency of the I.F. signal is found to be higher than the upper frequency limit $f_H$ when the contents of latch memory circuits 28 and 29 are judged, then the synthesizer circuit 5 acts to lower the local oscillator frequency by a fixed amount (e.g. 200 kHz). The frequency division ratios of the variable frequency dividers 22 and 23 are held unchanged, and after the requisite detection delay time, the frequency comparison signal state is stored in latch memory circuit 28. If the resultant output signal from latch memory circuit 28 is now judged to be at the H level, indicating that further frequency correction is required, the above sequence of steps is repeated, to further lower the local oscillator frequency by the fixed amount. These operations are repetitively continued until it is judged that the output signal from latch memory circuit 28 is at the L level, i.e. that the center frequency of the I.F. signal is below the upper limit frequency $f_H$.

In the above description, the controller 27 and the synthesizer circuit 5 have been described as operating mutually separately. However in an actual A.F.C. system most of the functions performed by controller 27 and synthesizer circuit 5, other than the production of a frequency control voltage, can be executed by a single control means, i.e. by a single microprocessor which has been suitably programed.

As stated hereinabove with reference to the example of FIG. 3, it is desirable that the degree of frequency control accuracy provided by the A.F.C.
circuit should be within approximately ±300 kHz, i.e. the frequency error range should ±300 kHz with respect to the specified center frequency of the I.F. signal. Thus each of the quantities ($F_S \cdot N_{IH}/N_{SH} - f_O$), and ($f_O - F_S \cdot N_{IL}/N_{SL}$) should be selected to be within 300 kHz. To lower the modulation index of the frequency-divided I.F. signal to a sufficient degree such as to ensure that erroneous operation of frequency comparator 24 will not result due to FM modulation of the I.F. signal, each of the frequency division ratios $N_{IH}$ and $N_{IL}$ should be made equal to approximately 50,000. For example, assuming that the specified I.F. frequency is 510 MHz, the frequency of the reference frequency is 4 MHz, the conditions outlined above will be satisfied for the following values:
frequency division ratio $N_{IH} = 51030$,
frequency division ratio $N_{IL} = 50970$, and
reference frequency frequency division ratios $N_{SH} = N_{SL} = 400$.

In the embodiment of FIG. 7, the I.F. signal is applied directly to a variable frequency divider 22 which is contained within a PLL-LSI section 25. However if necessary, preliminary frequency division of the I.F. signal can be performed using a pre-scaler before the I.F. signal is supplied to PLL-LSI section 25. In this case the overall frequency division ratio for the fis will be the product of the frequency division ratio of the pre-scaler and the variable frequency divider which is contained within the PLL-LSI section 25.

In the above embodiment, the frequency division ratios of variable frequency divider 23 are $N_{SH} = N_{SL}$. However if a pre-scaler is used, and the pre-scaler is used for the reference frequency, and this has a frequency division ratio of $N_P$, then the actual frequency division ratios applied to the reference frequency will be $N_P \cdot N_{SH}$ and $N_P \cdot N_{SL}$. As a result there will be a reduction of freedom to select desired values for the effective frequency division ratios. In order to maximize the degree of accuracy of establishing the frequency error range limits, it is important that $N_{SH}$ and $N_{SL}$ can be arbitrarily selected.

In recent years it has become general practice to perform setting of the frequency division ratios within a circuit such as that of section 25 by a suitably programed microprocessor. Thus as previously stated, such a microprocessor can also perform the functions of the controller 27, and in addition could perform those of the latch memory circuits 28 and 29, while if the synthesizer circuit 5 employs a voltage synthesizer type of PLL based on a D/A converter, then the functions of synthesizer circuit 5 could also be realized by microprocessor control.

The first embodiment of the present invention described above with reference to FIG. 7 provides the advantage of highly accurate frequency control, as does the example of FIG. 3. However the embodiment of the present invention shown in FIG. 7 has the further advantage of a more simple circuit configuration, since it is only necessary to use a single frequency comparator and a single low-pass filter. Thus, an A.F.C. system according to the present invention can be manufactured at lower cost than an A.F.C. system such as that of FIG. 3.

The modulation index of the I.F. signal in a receiver for reception of wide-band FM signals (e.g. from an earth satellite) is fairly high. This can result in erroneous operation of the frequency comparator of an A.F.C. system according to the present invention, if the frequency comparator is of digital type having the configuration of FIG. 5 and the input/output characteristic of FIG. 4. In order to sufficiently reduce the modulation index of the frequency-divided I.F. signal therefore, it is necessary to make the frequency division ratios $N_{IH}$ and $N_{IL}$ sufficiently high, in order to ensure correct operation of the frequency comparator. Furthermore in the case of a signal transmitted from an earth satellite containing a video signal component, an energy dispersal signal is superimposed on the video signal before transmission, in order to prevent certain reception failure conditions, which do not arise in the case of land-based microwave radio communication systems. The frequency of the energy dispersal signal is typically 30 Hz, producing a corresponding FM modulation deviation of 2 MHz p-p (approximately). Thus the modulation index resulting from the energy dispersal signal is approximately 67,000. Thus it is necessary to use frequency division ratios which are each greater than approximately 50,000 for the I.F. signal variable frequency divider. Due to the use of such a high value of frequency division ratio, the frequency difference between the frequency-divided I.F. signal and reference frequency at input to the frequency comparator (i.e. frequency comparator 25 in the above embodiment) will be only 1/50,000 of the difference between the detection limit frequencies $F_S \cdot N_{IH}/N_{SH}$ and $F_S \cdot N_{IL}/N_{SL}$.

Figure 9:
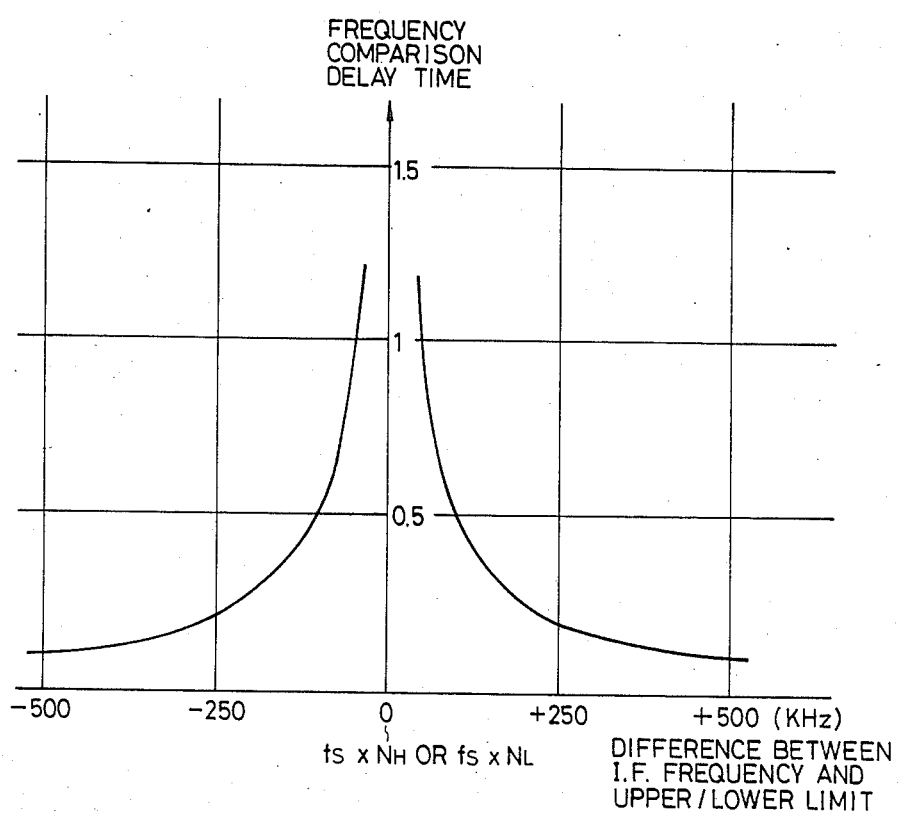
FIG. 9 is a graph showing the relationship between a delay time produced by a low-pass filter in the circuit of FIG. 7 and the degree of frequency error detection accuracy which is provided by the A.F.C. system.

For example a frequency difference of 300 kHz within the I.F. band will be converted into a frequency difference of 6 Hz at input to the frequency comparator, so that the frequency comparator output will contain a 6 Hz component. In order to integrate this 6 Hz signal component, and thereby obtain the DC component of the frequency comparator output as the frequency comparison signal, it is necessary that the integrating means (i.e. LPF 26 in the above embodiment) will cause the frequency comparison signal to lag behind the frequency comparator output by an amount which is at least equal to one period of the 6 Hz signal. Thus, a lag of approximately 0.17 seconds will occur before the change in level of the frequency comparator output signal is translated into a corresponding change in logic level of the frequency comparison signal. It can thus be understood that the closer the frequency error detection limits ($f_L$ and $f_H$) approach the specified I.F. frequency, i.e. the more accurate the frequency comparison operation is to be made, the longer will become the time required for the frequency comparison signal to reach a correct level after the I.F. signal moves out of the frequency error range. That is to say, as the desired accuracy of frequency comparison is increased, the lower will become the frequency components of the output signal produced from the frequency comparator circuit (for example, from frequency comparator circuit 24 in FIG. 7), so that the time constant of the low-pass filter required to derive the DC component of the frequency comparator circuit output signal (LPF 26 in FIG. 7) must be correspondingly increased. This relationship is illustrated in the graph of FIG. 9. Thus an appreciable time delay will elapse between the time of executing a frequency comparison operation and the subsequent time at which the frequency comparison signal level will accurately indicate the result of that comparison. Each time that frequency comparison operation is initiated, therefore, it is necessary for the system to wait for a predetermined "detection delay time", before storing the level of the frequency comparison signal in the appropriate latch memory circuit diagram. As can be understood from FIG. 9, the detection delay time should be made approximately one second, if the frequency accuracy is to be held to 50 kHz, i.e. if correction overshoot resulting from A.F.C. operation is to be limited to 50 kHz.

The process of A.F.C. pull-in operation will now be described, i.e. operation to bring the center frequency of the I.F. signal within the predetermined frequency error range after that center frequency has been moved substantially out of the frequency error range as a result of a tuning operation to change the reception channel. In the following it will be assumed that the maximum pull-in range of the A.F.C. system is 3 MHz, that the center frequency of the I.F. frequency is in error by 3 kHz relative to the predetermined I.F. frequency, the frequency control accuracy is to be 50 kHz (so that a 1-second detection delay time is required) and that fine-adjustment frequency control of the local oscillator frequency is performed in discrete frequency shifts, each of 200 kHz. In this case, after a tuning operation is performed to select reception of a new channel frequency, the center frequency of the I.F. signal will be moved in successive steps of 200 kHz by the control operation of controller 27 and synthesizer circuit 5, as described hereinabove, i.e. by successive steps of fine frequency adjustment of the local oscillator frequency by 200 kHz. This process is illustrated in FIGS. 10A and 10B. As shown, a total of 14 of such frequency shifts will be required before the center frequency of the I.F. signal is pulled into the frequency error range, i.e. until A.F.C. lock operation is achieved. Thus the total time required to achieve A.F.C. pull-in will be (1 second × 14) = 14 seconds, assuming that successive 200 kHz fine-adjustment frequency shifts are separated by the one-second detection delay intervals referred to above, i.e. the 1 second delay time which is required during normal A.F.C. operation in order to prevent overshoot of frequency correction due to the frequency comparison signal lag time mentioned hereinabove.

Figure 1:
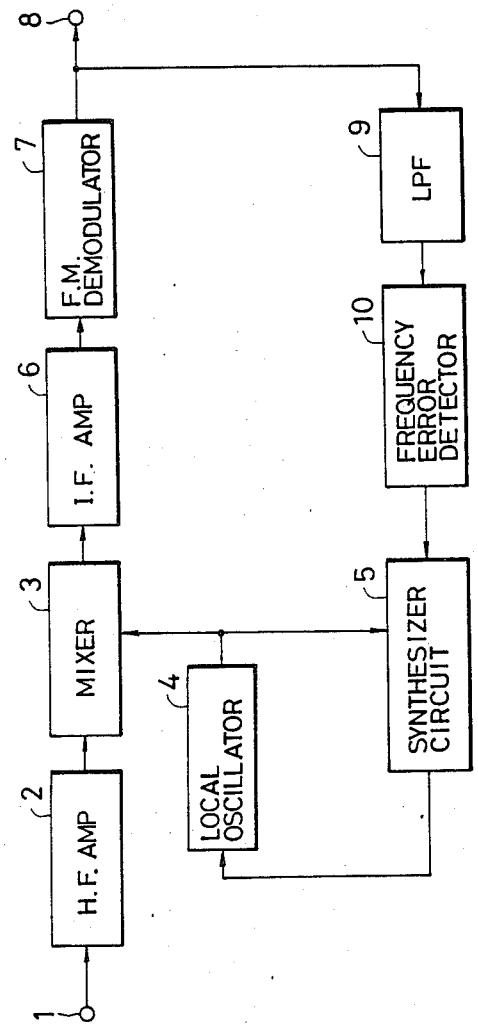
FIG. 1 is a block circuit diagram of a prior art example of an A.F.C. system for an FM receiver.
Figure 2:
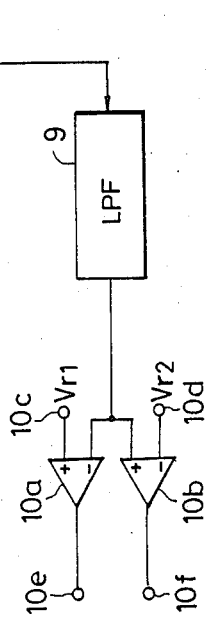
FIG. 2 is a circuit diagram of a frequency error detection circuit used in the example of FIG. 1.

This excessive length of time required for A.F.C. pull-in to be completed is a serious problem. It should be noted that a similar problem arises with a prior art type of A.F.C. system such as that of FIG. 1 described hereinabove. In that case it is necessary to utilize a low-pass filter to derive the DC component of the demodulated signal, and to compare this DC level with a reference level in order to detect a frequency error of the center frequency of the I.F. signal. In the case of signal transmissions from an earth satellite, having an energy dispersal component superimposed on the video signal, it is necessary for this low-pass filter to have a substantially high value of time constant, in order to prevent errors in the operation of the frequency detection circuits. Due to the time lag introduced by this low-pass filter, it is necessary to apply a detection waiting time, i.e. time delay to the transfer of the output from frequency error detection circuit 10 to the synthesizer circuit 5. As the accuracy of frequency control is increased, it is necessary to correspondingly lengthen this time delay, so that the problem of lengthy A.F.C. pull-in time also occurs with such a prior art circuit.

Figure 11:
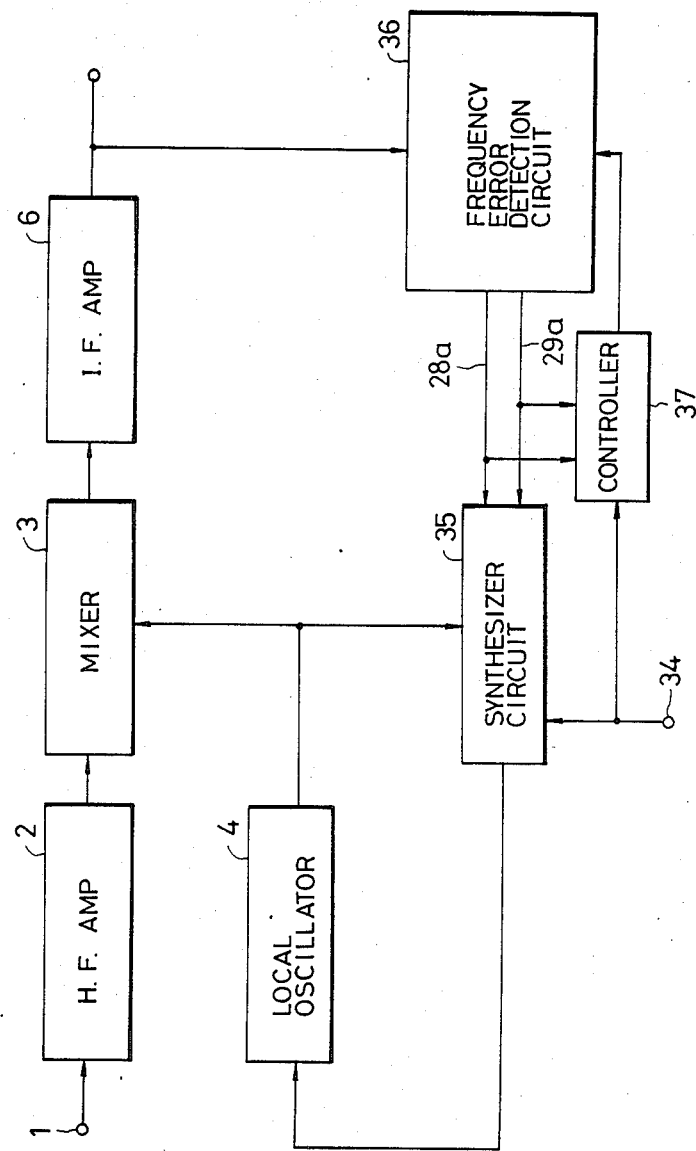
FIG. 11 is a block circuit diagram of a second embodiment of the present invention.

A second embodiment of the present invention will now be described, referring first to FIGS. 11 and 12, whereby the problem of long A.F.C. pull-in time after a channel tuning change is substantially overcome. Referring first to FIG. 11A, the block designated as frequency error detection circuit 36 consists of the combination of circuit blocks in the embodiment of FIG. 7 which receive the I.F. signal and produce as outputs the first and second latch memory circuits from latch memory circuits 28 and 29 respectively over output lines designated as 28a and 28b respectively, i.e. controller 27, variable frequency dividers 22 and 23, reference signal oscillator 11, frequency comparator 24, LPF 26 and latch memory circuits 28, 29. However it should be noted that this second embodiment is also applicable to the previously filed application by the assignee of the present invention described above with reference to FIG. 3, in which case block 36 would correspond to the combination of blocks which receive the I.F. signal from I.F. amplifier 6 and produce frequency comparison signals from LPFs 14 and 15.

Numeral 35 denotes a synthesizer circuit for determining and adjusting a frequency control voltage which is applied to a local oscillator 4, in accordance with a combination of output signals applied over latch memory output lines 29a, 29b, as in the case of the first embodiment described with reference to FIG. 7. Numeral 37 denotes a controller, having essentially the same functions as those of controller 27 of the first embodiment described above, but in addition having the function of determining the value of a variable detection delay time, as described hereinafter. Numeral 34 denotes an input terminal which is coupled to receive a tuning command signal, i.e. a signal designating a change in reception channel frequency by execution of a specific change in the level of control voltage applied to local oscillator 4 by synthesizer circuit 35. The controller 37 and synthesizer circuit 35 are each coupled to receive this tuning command signal from terminal 34. The controller 37 sets the detection delay time (i.e. the delay time between produced by the signal input section 35a to one of two different values, one of which is substantially lower than the other, in accordance with whether the system is operating in an A.F.C pull-in condition or has achieved A.F.C control. Specifically, during continuous reception of a specific channel, i.e. normal reception operation, this delay time is held at a sufficiently large value to ensure a high requisite degree of frequency control accuracy. As in the first embodiment described above, this frequency control accuracy will be assumed to be 50 kHz, so that a detection delay time of one second is required during normal A.F.C. control operation. When a tuning operation is performed to change the frequency of the selected channel, the center frequency of the I.F. signal of the newly selected channel will in general be substantially displaced from the specified I.F. frequency, and so must be brought towards that frequency by A.F.C. pull-in operation. With this embodiment of the present invention, when such a tuning operation is detected by the controller 37, 35d (from the tuning command signal applied thereto), then controller 37 acts to change the detection time delay to a value which is substantially shorter than that for normal operation, e.g preferably in the range of 0.1 to 0.3 times the delay value for normal operation. As a result, A.F.C. pull-in is accomplished in a substantially shorter time.

Subsequently, when the controller judges from the contents of latch memories 28 and 29 (as described hereinabove for the first embodiment) that that the center frequency of the I.F. signal has been brought within the upper and lower detection limits $f_H$ and $f_L$ then controller 37 immediately changes the detection delay time to the normal value (i.e. one second, in the example given above). Due to this immediate restoration of the normal delay time, the next frequency shift executed by the synthesizer circuit 35 will not result in a large overshoot of the center frequency of the I.F. signal beyond the frequency error range, as would otherwise occur. Thereafter, with the center frequency of the I.F. signal now brought within the predetermined frequency error range, normal A.F.C. operation to hold the I.F. frequency within that range is executed as described hereinabove with reference to the first embodiment.

Figure 14:
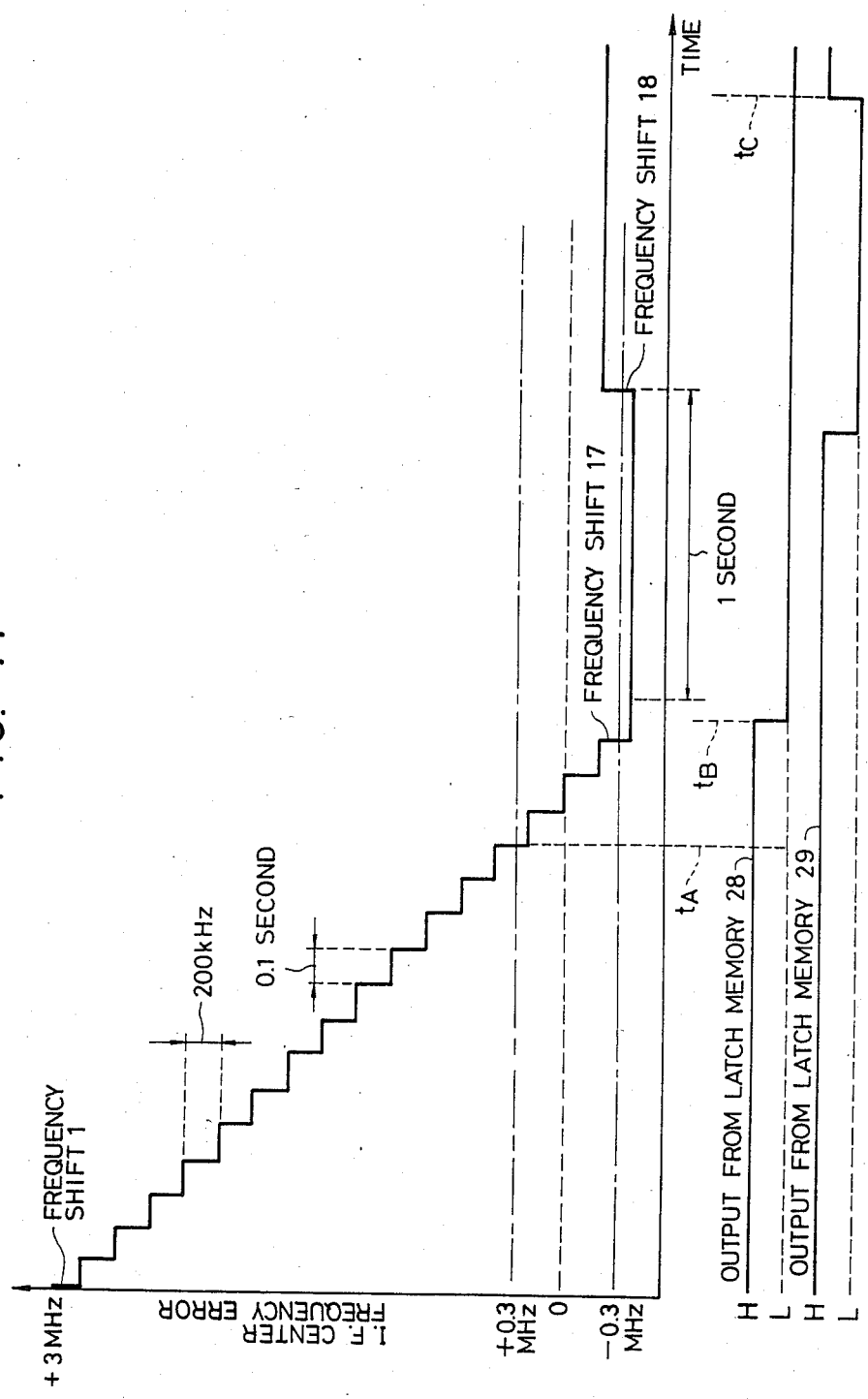
FIG. 14 shows the variation with respect to the time axis of successive local oscillator frequency shifts performed during the example of A.F.C pull-in operation shown in FIGS. 12 and 13, and the corresponding variations of latch memory output signals.

This A.F.C. pull-in operation of the second embodiment is illustrated in FIGS. 12, 13 and 14. It is assumed that, following a tuning operation to change to a new channel frequency, the center frequency of the I.F. signal is displaced from the specified I.F. frequency by 3 MHz, and that the amount of each frequency adjustment shift is limited to 200 kHz. Upon input of the tuning command signal from terminal 34, the controller 37 changes the delay time produced by the signal input section 35c from the normal value (e.g. 1 second) to a shorter value which will be assumed to be 0.1 seconds. Thereafter, each of the 200 kHz successive shifts in the center frequency of the I.F. signal which are numbered from 1 to 17 in FIGS. 12 to 14 will occur at intervals of 0.1 seconds. As a result of the 14th of these 200 kHz frequency shifts, i.e. at time $t_A$ shown in FIG. 14, the center frequency of the I.F. signal will fall below the upper frequency limit $f_H$ of the frequency error range, which in this example is +300 kHz with respect to the predetermined center frequency. However due to the delay produced by LPF 26 as described above, the output from latch memory circuit 28 will only change from the H to the L level (indicating that the center frequency has come below the upper frequency limit) at a subsequent time indicated as $t_B$ in FIG. 14, i.e. after the 17'th 200 kHz frequency shift has been initiated, in this example. When this L level condition of latch memory 28 output is detected by the controller 37, the detection delay time is immediately changed to 1 second. As a result, although the 17th frequency shift may have moved the center frequency of the I.F. signal slightly below the lower frequency limit $f_L$, the subsequent one-second detection delay time will allow the frequency control signal (and hence the output from latch memory 29) to fall from the H to the L level before the memory contents are next judged by controller 37. At that time, controller 37 recognizes from the L level condition of the output from latch memory 29 that the center frequency of the I.F. signal has fallen below the lower limit frequency $f_L$. As a result, the next 200 kHz frequency shift (i.e. the 18'th) serves to increase the center frequency, and so bring that frequency within the frequency error range. As a result, at the start of the next 1-second detection delay interval (i.e. after time point $t_C$ in FIG. 14), A.G.C. pull-in operation has been completed, as indicated by the output signal from latch memory 28 being at the L level and that from latch memory 29 being at the H level.

It can be understood from the above that, if the detection delay time were to remain at 0.1 seconds for the 18'th frequency step, then the center frequency of the I.F. signal would substantially overshoot the lower frequency limit $f_L$, i.e. by approximately 500 kHz.

It can thus be understood that in this example, the total time required for A.F.C. pull-in operation to be completed is:

$$0.1 \text{ seconds} \times 17 + 1 \text{ second} \times 1 = 2.7 \text{ seconds.}$$

This is therefore substantially shorter than the time required for A.F.C. pull-in by an A.F.C. system which does not execute selective changeover of the detection signal delay time in the manner described above for the second embodiment.

If the delay time during A.F.C. pull in operation is set to 0.3 seconds rather than 0.1 seconds in the above example, then the total time required for completion of pull-in would be appoximately 5 seconds. The inventor has found that the shortened detection delay time during A.F.C. pull-in operation should preferably be within the range of 0.1 to 0.3 times the value of detection delay time which is established during normal A.F.C. operation.

Figure 15:
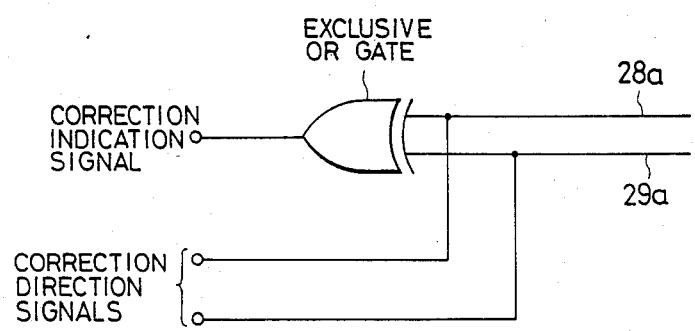
FIG. 15 is an example of a circuit for converting the output signals from the first and second latch circuits into a correction indication signal and correction direction signals.

In the description of the above embodiments it has been assumed that the controller (27 or 35) directly utilizes the data contents of latch memories 28 and 29, with the combination of levels of these data contents representing whether the center frequency of the I.F. signal is within or outside the frequency error range. However it is equally possible to employ a circuit for converting the data held in latch memory 28 and 29, i.e. the output signals from latch memory 28 and 29 representing that data, into a correction indication signal whose level indicates whether correction of the center frequency of the I.F. signal is required, and correction direction signals which indicate the required direction for such correction. An example of a circuit to perform this function is shown in FIG. 15. Output signals from latch memories 28 and 29 are supplied over lines 28a, 29a respectively to the inputs of an exclusive-OR gate, which thereby produces an output signal at the L level if no correction of the I.F. center frequency is required, and at the H level if correction is required. The output signals from latch memory 28 and latch memory 29 can be directly employed as correction direction signals, as will be apparent from the description given hereinabove with reference to FIGS. 8a and 8B.

Figure 16:
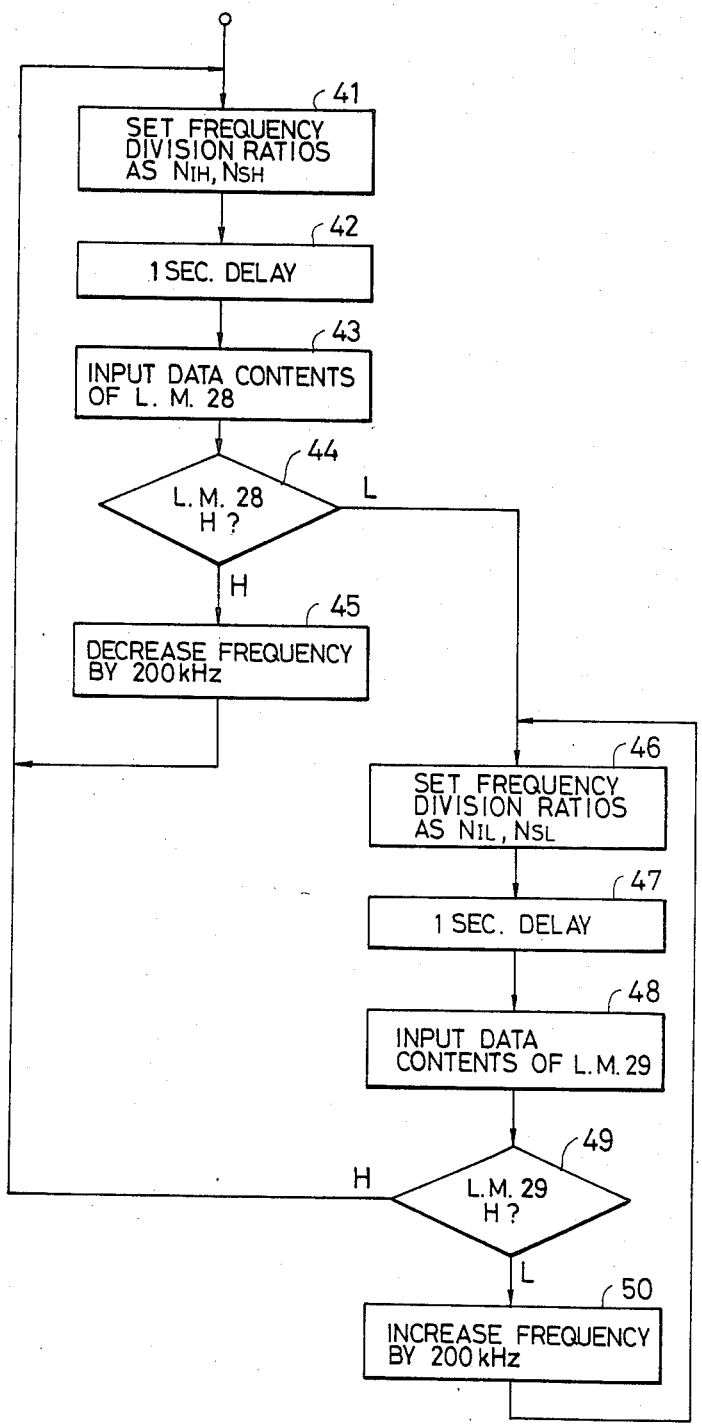
FIG. 16 is a flow diagram of operations executed by a microprocessor to implement various functions of a controller and a synthesizer circuit of the embodiment of FIG. 7.

As stated hereinabove, the functions of controller 27 and of at least a part of synthesizer circuit 5, in the first embodiment of the invention shown in FIG. 7, can be implemented by a digital microprocessor. FIG. 16 is a flow diagram to illustrate the operation of such a microprocessor. When channel switching is executed to select a new reception channel (e.g. by a tuning command signal applied to synthesizer circuit 5, causing that circuit to make a predetermined change in the local oscillator frequency), the microprocessor system (referred to in the following simply as the system) enters the operation flow shown in FIG. 17, at step 41. In step 41, the system sets the frequency division ratios of the variable frequency dividers 22 and 23 to be $N_{IH}$ and $N_{SH}$ respectively. Next, in step 42, waiting is performed for a detection delay time of 1 second. This is the time required for a change in level of the output signal (DC component) from frequency comparator 24 to result in a change in logic level of the frequency comparator signal from LPF 26. In the succeeding step 43, the stored contents of latch memory (indicated as L.M.) 28 are read into the system. A decision is then made, in step 44, as to whether the latch memory contents are at the H or the L level. If they are at the H level then this indicates that the center frequency of the I.F. signal is higher than the upper limit frequency $f_H$, in which case step 45 is executed. In this step, the system commands synthesizer circuit 5 to increase the local oscillator frequency by 200 kHz, and operation then returns to step 41. Processing then successively proceeds around the loop of steps just described, until it is detected in step 44 that the contents of latch memory 28 are at the L level. In this case, operation proceeds to step 46, in which the system sets the frequency division ratios of the variable frequency dividers 22 and 23 to $N_{IL}$ AND $N_{SL}$. Operation then waits for a detection delay interval of 1 second, (step 47) then proceeds to step 48, in which the contents of latch memory 29 are read in. A decision is then made as to the level of the latch memory 29 data (step 49), and if the data is at the L level (indicating that the center frequency of the I.F. signal is lower than the lower limit frequency $f_L$), then the system commands the synthesizer circuit 5 to increase the local oscillator frequency by 200 kHz. Operation then returns to step 46. The loop of steps from 46 to 50 is then cyclically repeated, until it is determined in step 49 that the contents of latch memory 29 are at the H level, which indicates that the center frequency of the I.F. signal is higher than the lower limit frequency $f_L$, i.e. is within the frequency error range. Operation then returns to step 41.

Figure 17:
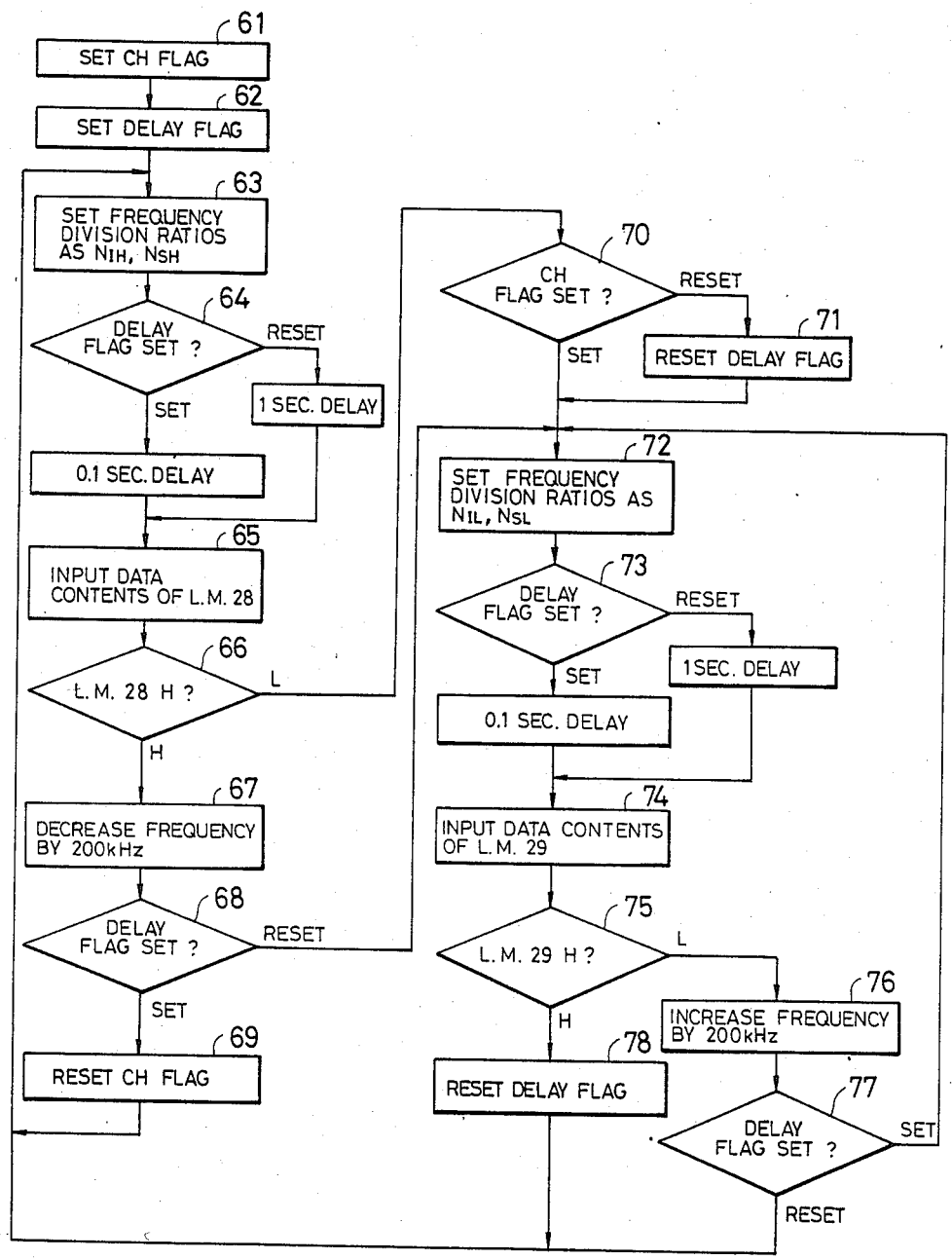
FIG. 17 is a flow diagram of operations executed by a microprocessor to implement various functions of a controller and a synthesizer circuit of the embodiment of FIG. 11.

It can thus be understood from the flow diagram of FIG. 17 that in this example, following a channel switching operation, the frequency division ratios of the variable frequency dividers 22 and 23 are set as $N_{IH}$ and $N_{SH}$. However it should be noted that it would be equally possible to initially set these frequency division ratios to $N_{IL}$ AND $N_{SL}$, i.e. to enter the operation flow in step 46 rather than step 41.

In addition, as stated hereinabove, the controller 35 and section 35a of the synthesizer circuit 35 of the second embodiment, shown in FIGS. 11 and 12, can be implemented as functions of a microprocessor. FIG. 17 is shows an example of a suitable microprocessor flow diagram for the second embodiment. First, when channel switching is executed (by application of a tuning command signal to terminal 34 in FIG. 11), a channel flag is set in an initial step 61, then a delay flag is set in step 62. The set status of the delay flag indicates that the frequency detection delay time is to be 0.1 seconds, as opposed to the normal delay value of 1 second. In the next step, 63, the frequency division ratios of the variable frequency dividers 22 and 23 are set as $N_{IH}$ and $N_{SH}$. In succeeding step 64, a decision is made as to whether the delay flag is set or not. If the delay flag is set, then operation waits for a delay time of 0.1 second, while if the delay flag is reset then operation waits for a delay time of 1 second. On completion of this delay time, the contents of latch memory 28 are read out. If the contents of latch memory 28 are at the H level, in the succeeding decision step 66, then this indicates that the center frequency of the I.F. signal is higher then the upper limit frequency $f_H$, and so the system commands the control voltage generating circuit 35f (shown in FIG. 12) to decrease the local oscillator frequency by 200 kHz. Next, in step 68, the system judges whether the delay flag is set, and if the flag is set then it is reset in succeeding step 69. Operation then returns to step 63.

In the example of A.F.C. pull-in described above with reference to FIGS. 12 to 14, operation is repeated around the loop containing steps 63 to 69, for a total of 16 circulations around the loop. On the 17th repetition, the output from latch memory 28 is judged to be at the L level in step 66, thereby indicating that the center frequency of the I.F. signal has become lower than the upper limit frequency $f_H$.

As stated above, the center frequency is reset in step 69. However it is possible to arrange that, after the center frequency has been reset during an initial circulation around the loop described above, step 69 is subsequently bypassed during successive loop repetitions.

If the data in latch memory 28 is found to be at the L level in step 66, then operation proceeds to step 70, in which a decision is made as to whether the center frequency is set or reset. If the channel flag is reset, then the delay flag is reset in step 71, and operation proceeds to step 72. As a result of this resetting of the delay flag, the detection delay time is restored to 1 second. If however the center frequency is found to be set in step 70 (i.e. indicating that A.F.C. pull-in operation is to commence from an initial I.F. center frequency which is below than the lower limit frequency $f_L$) then operation paroceeds directly to step 72. In this step, the frequency division ratios of the variable frequency dividers 22 and 23 are established as $N_{IL}$ AND $N_{SL}$. In the succeeding step 73, a decision is made as to whether the delay flag is set or reset, and if the flag is reset then the operation waits during a detection delay time of 1 second. If the delay flag is set, then the delay time is reduced to 0.1 seconds. Upon completion of this delay interval, step 74 is entered, in which the system reads out the data held in latch memory 29. If this is found to be at the L level, in step 75, then this indicates that the center frequency of the I.F. signal is below the lower limit frequency $f_L$, and so the system commands the control voltage generating circuit 35f to produce an increase of 200 kHz in the local oscillator frequency. A decision is then made, in step 77, as to whether the delay flag has been set or reset. If the delay flag is set, then operation returns to step 72.

In the example described above with reference to FIGS. 12 to 14, such a frequency increase of 200 kHz is executed as the 18th frequency shift, to complete A.F.C. pull-in operation.

If the delay flag is found to have been reset, in step 77, then operation returns to step 63. Thereafter the center frequency of the I.F. signal is compared with the upper limit frequency $f_H$ of the frequency error range, using a 1-second detection delay time. Subsequently, each time that the local oscillator frequency has been decremented by 200 kHz (in step 67), processing will proceed from step 68 to step 72 (since the the delay flag is reset). The center frequency of the I.F. signal is then compared with the lower frequency limit $f_L$ (in steps 72 to 75). If no correction is required, then processing returns to step 63, and the I.F. center frequency is compared again with the upper limit frequency $f_H$. In this way, so long as the center frequency of the I.F. signal remains within the frequency error range, it is compared with the upper and lower limits of the frequency error range in a successively alternating manner.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. An automatic frequency control system for performing correction of a frequency error of a center frequency of a frequency-modulated intermediate frequency signal with respect to a predetermined intermediate frequency value such as to hold the magnitude of said frequency error within a predetermined frequency error range, for a frequency modulation receiver system including local oscillator circuit means for producing a local oscillator signal and a frequency mixer coupled to receive said local oscillator signal for producing said frequency-modulated intermediate frequency signal, said automatic frequency control system comprising:
    control means:
    frequency comparison means controlled by said control means to selectively operate in a first status for comparing said center frequency of said intermediate frequency signal with an upper limit frequency of said frequency error range and in a second status for comparing said center frequency of said intermediate frequency signal with a lower limit of said frequency error range, and for producing a frequency comparison signal indicative of results of said frequency comparisons;
    first and second latch memory means controlled by said control means to store said frequency comparison signal as data indicative of the relationship between said center frequency of said intermediate frequency signal and said upper and lower limit frequencies, and;
    frequency adjustment means controlled by said control means for adjusting said local oscillator frequency;
    said control means operating, following said frequency comparison operation, to determine whether said data stored in said first and second latch memory means indicates that said center frequency of said intermediate frequency signal is within said frequency error range, and operating when said center frequency is determined to be within said frequency error range to execute successively alternating comparisons of said center frequency of said intermediate frequency signal with said upper and lower limits respectively by said frequency comparison means, and to store the level of said frequency comparison signal in said first latch memory means following a comparison of said center frequency of said intermediate frequency signal with said upper limit frequency and to store the level of said frequency comparison signal in said second latch memory means following a comparison of said center frequency of said intermediate frequency signal with said lower limit frequency, said control means further operating, when said center frequency of said intermediate frequency signal is determined to be outside said frequency error range as indicated by said data stored in said first and second latch memory means, to control said frequency adjustment means such as to adjust said local oscillator frequency to bring said center frequency of said intermediate frequency signal within said frequency error range.

2. An automatic frequency control system according to claim 1, in which said control means operates, when said center frequency of said intermediate frequency signal is determined to be higher than said upper frequency limit, as indicated by said data stored in said first and second latch memory means, to repetitively execute a series of operations comprising:
    comparison of said center frequency of said intermediate frequency signal with said upper frequency limit;
    storage of said frequency comparison signal level in said first latch memory means, and;
    controlling said frequency adjustment means such as to decrease said local oscillator frequency by a fixed amount,
    and in which said control means operates, when said center frequency of said intermediate frequency signal is determined to be lower than said lower frequency limit, as indicated by said data stored in said first and second latch memory means, to repetitively execute a series of operations comprising:
    comparison of said center frequency of said intermediate frequency signal with said lower frequency limit;
    storage of said frequency comparison signal level in said second latch memory means, and;
    controlling said frequency adjustment means such as to increase said local oscillator frequency by a fixed amount.

3. An automatic frequency control system according to claim 1, in which said frequency comparison means comprise:
    reference signal oscillator means for producing a reference signal at a fixed frequency $f_s$;
    first variable frequency divider means coupled to receive said frequency modulated intermediate frequency signal for producing a frequency divided intermediate frequency signal, and controlled by said control means means to selectively perform frequency division by frequency division ratios $N_{IH}$ and $N_{IL}$ during operation in said first and second operating statuses respectively, where $N_{IH}$ is greater than $N_{IL}$;

second variable frequency divider means coupled to receive said reference signal, for producing a frequency-divided reference signal, and controlled by said control means to selectively perform frequency division by first and second frequency division ratios $N_{SH}$ and $N_{SL}$ during operation in said first and second operating statuses respectively, where $N_{SH}$ is greater than or equal to $N_{SL}$, with said values $f_s$, $N_{IH}$, $N_{IL}$, $N_{SH}$ and $N_{SL}$ being respectively selected such that a frequency value $f_s \cdot N_{IH}/N_{SH}$ is equal to said upper limit of said frequency error range, and a frequency value $f_s \cdot N_{IL}/N_{SL}$ is equal to said lower limit of said frequency error range, and;

frequency comparison circuit means for comparing the frequencies of said frequency-divided reference signal and said frequency-divided intermediate frequency signal, to produce said frequency comparison signal.

4. An automatic frequency control system according to claim 3, in which said frequency comparison means further comprises low-pass filter means coupled to receive an output signal from said frequency comparison circuit, for thereby producing said frequency comparison signal.

5. An automatic frequency control system according to claim 4, and further comprising delay control means for establishing a predetermined data transfer time delay in transferring said stored data in said first and second latch memory means to be analyzed by said control means.

6. A automatic frequency control system according to claim 5, in which the duration of said data transfer time delay is held constant.

7. An automatic frequency control system according to claim 5, in which said frequency adjustment means is responsive to an externally supplied tuning command signal for changing said frequency of oscillation of said local oscillator by a specific amount for thereby changing a selected reception channel, and in which said delay control means is responsive to said tuning command signal for setting said data transfer time delay to a first value thereof and whereby, in response to a subsequent change in said stored data in said latch memory means indicating that said center frequency of said intermediate frequency signal has moved within said frequency error range, said delay control means acts to set said data transfer delay time to a second value thereof which is substantially longer than said first value thereof and to thereafter maintain said data transfer delay time at said second value thereof.

8. An automatic frequency control system according to claim 7, in which said second data transfer delay time value is in the range of 0.1 to 0.3 times said first data transfer delay time value.

9. An automatic frequency control system according to claim 2, in which said local oscillator circuit means comprises a voltage-controlled oscillator for determining said local oscillator frequency, and in which said frequency adjustment means comprises a frequency control voltage synthesizer circuit for producing a control voltage to determined a frequency of oscillation of said voltage controlled oscillator, said frequency control voltage synthesizer circuit being responsive to said data stored in said first and second latch memory means for producing changes in said control voltage to execute said fixed amounts of increase or decrease of said local oscillator frequency.

10. An automatic frequency control system according to claim 1 in which said control means is implemented by functions executed by a digital microprocessor.

11. An automatic frequency control system according to claim 6, in which said delay control means is implemented by functions executed by a digital microprocessor.

12. An automatic frequency control system for performing correction of a frequency error of a center frequency of a frequency-modulated intermediate frequency signal with respect to a predetermined intermediate frequency value such as to hold the magnitude of said frequency error within a predetermined frequency error range, for a frequency modulation receiver system including local oscillator circuit means for producing a local oscillator signal and a mixer coupled to receive said local oscillator signal for producing said frequency-modulated intermediate frequency signal, said automatic frequency control system comprising:

control means:

frequency comparison means controlled by said control means to selectively operate in a first status for comparing said center frequency of said intermediate frequency signal with an upper limit frequency of said frequency error range and in a second status for comparing said center frequency of said intermediate frequency signal with a lower limit of said frequency error range, and for producing a frequency comparison signal indicative of results of said frequency comparisons;

first and second latch memory means controlled by said control means to store said frequency comparison signal as data indicative of the relationship between said center frequency of said intermediate frequency signal and said upper and lower limit frequencies;

frequency adjustment means controlled by said control means for adjusting said local oscillator frequency;

said control means operating, following said frequency comparison operation, to determine whether said data stored in said first and second latch memory means indicates that said center frequency of said intermediate frequency signal is within said frequency error range, and operating when said center frequency is determined to be within said frequency error range to execute successively alternating comparisons of said center frequency of said intermediate frequency signal with said upper and lower limits respectively by said frequency comparison means, and to store the level of said frequency comparison signal in said first latch memory means following each comparison of said center frequency of said intermediate frequency signal with said upper limit frequency and to store the level of said frequency comparison signal in said second latch memory means following each comparison of said center frequency of said intermediate frequency signal with said lower limit frequency, said control means further acting, when said center frequency of said intermediate frequency signal is determined to be outside said frequency error range as indicated by said data stored in said first and second latch memory means, to control said frequency adjustment means such as to adjust said local oscillator frequency to bring said center frequency of said intermediate frequency signal within said frequency error range, and;

delay control means for establishing a predetermined data transfer delay time for transfer of said stored data from said first and second latch memory means to be analyzed by said control means, said delay control means being responsive to said tuning command signal for setting said data transfer time delay to a first value thereof;

wherein, in response to a subsequent change in said stored data in said latch memory means indicating that said center frequency of said intermediate frequency signal has moved within said frequency error range, said delay control means operates to set said data transfer delay time to a second value thereof which is substantially longer than said first value thereof and to thereafter maintain said data transfer delay time at said second value thereof.

13. An automatic frequency control system according to claim 11, in which said second data transfer delay time value is in the range of 0.1 to 0.3 times said first data transfer delay time value.

14. An automatic frequency control system according to claim 12, in which said frequency comparison means comprise:

reference signal oscillator means for producing a reference signal at a fixed frequency $f_s$;

first variable frequency divider means coupled to receive said frequency modulated intermediate frequency signal for producing a frequency divided intermediate frequency signal, and controlled by said control means means to selectively perform frequency division by frequency division ratios $N_{IH}$ and $N_{IL}$ during operation in said first and second operating statuses respectively, where $N_{IH}$ is greater than $N_{IL}$;

second variable frequency divider means coupled to receive said reference signal, for producing a frequency-divided reference signal, and controlled by said control means to selectively perform frequency division by first and second frequency division ratios $N_{SH}$ and $N_{SL}$ during operation in said first and second operating statuses respectively, where $N_{SH}$ is greater than or equal to $N_{SL}$, with said values $f_s$, $N_{IH}$, $N_{IL}$, $N_{SH}$ and $N_{SL}$ being respectively selected such that a frequency value $f_s \cdot N_{IH}/N_{SH}$ is equal to said upper limit of said frequency error range, and a frequency value $f_s \cdot N_{IL}/N_{SL}$ is equal to said lower limit of said frequency error range, and;

frequency comparison circuit means for comparing the frequencies of said frequency-divided reference signal and said frequency-divided intermediate frequency signal, to produce said frequency comparison signal.

* * * * *